(12) United States Patent
Lennen

(10) Patent No.: US 11,483,026 B1
(45) Date of Patent: Oct. 25, 2022

(54) METHOD AND APPARATUS FOR TMBOC TRANSMISSION WITH NARROWBAND RECEIVERS

(71) Applicant: Samsung Electronics Co., Ltd., Gyeonggi-do (KR)

(72) Inventor: Gary Lennen, Cupertino, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/320,645

(22) Filed: May 14, 2021

(51) Int. Cl.
*H04B 1/7093* (2011.01)
*H03M 3/00* (2006.01)
*H04B 1/7117* (2011.01)
*H04B 1/7087* (2011.01)
*H04B 7/06* (2006.01)

(52) U.S. Cl.
CPC .......... *H04B 1/7093* (2013.01); *H03M 3/368* (2013.01); *H04B 1/7087* (2013.01); *H04B 1/7117* (2013.01); *H04B 7/0678* (2013.01)

(58) Field of Classification Search
CPC .. H04B 1/7093; H04B 1/7087; H04B 1/7117; H04B 7/0678; H03M 3/368
See application file for complete search history.

(56) References Cited

U.S. PATENT DOCUMENTS

| | | | |
|---|---|---|---|
| 6,366,938 B1 * | 4/2002 | Levison | H03H 17/0254 375/E1.018 |
| 7,486,717 B2 | 2/2009 | DeWilde et al. | |
| 7,994,977 B2 | 8/2011 | Lennen | |
| 9,231,649 B2 | 1/2016 | Chae et al. | |

FOREIGN PATENT DOCUMENTS

| | | | | |
|---|---|---|---|---|
| CN | 1185064 A | * | 6/1998 | G06F 17/15 |
| EP | 1109323 A2 | * | 6/2001 | H04B 1/7075 |
| EP | 1222750 B1 | * | 4/2008 | H04B 1/7093 |
| WO | WO-2004086077 A1 | * | 10/2004 | G01S 1/045 |

OTHER PUBLICATIONS

Global Positioning Systems Directorate Systems Engineering & Integration Interface Specification IS-GPS-800C, Sep. 2, 2012 . . . Navstar GPS Space Segment/User Segment L1C Interface, pp. 128.

* cited by examiner

*Primary Examiner* — Jean B Corrielus
(74) *Attorney, Agent, or Firm* — The Farrell Law Firm, P.C.

(57) ABSTRACT

A method and an apparatus are provided for improving a carrier to noise density ratio (CNO) of a matched filter. A signal is received at a signal register of the matched filter. A local code is received at a local code register and a nulling register of the matched filter. An adder tree of the matched filter correlates the signal register and the local code register with respect to the nulling register to obtain a correlation result. The nulling register prevents high frequency samples of the signal register from affecting the correlation result.

20 Claims, 6 Drawing Sheets

| Tx mode | Rx mode | Rx bandwidth (MHz) | C/N0 received (dB-Hz) | C/N0 loss (dB) | C/N0 gain (dB) | mode |
|---|---|---|---|---|---|---|
| BOC(6,1) | BOC(6,1) | 10 | 49.96 | 0 | | full |
| BOC(6,1) | BOC(1,1) | 10 | 48.90 | 1.06 | | |
| BOC(6,1) | BOC(1,1) | 3 | 48.61 | 1.35 | | consumer |
| BOC(6,1) | BOC(1,1)* | 3 | 49.20 | 0.76 | 0.59 | modified |

FIG. 4

METHOD AND APPARATUS FOR TMBOC TRANSMISSION WITH NARROWBAND RECEIVERS

FIELD

The present disclosure relates generally to global navigation satellite system (GNSS) receivers, and more particularly, a method and an apparatus for improving a carrier to noise density ratio ($CN_0$) for a time-multiplexed binary offset carrier (TMBOC) transmission with narrowband receivers.

BACKGROUND

A binary offset carrier (BOC) format is used for modernized GNSS signals. Most BOC implementations are a variant of continuous BOC (CBOC). For example, CBOC(1,1,6) transmits BOC(1,1) using $10/11$ths available power and BOC (6,1) using $1/11^{th}$ available power. BOC(1,1) has main spectral lobes at +/−1.023 MHz, and CBOC(6,1) has main spectral lobes at +/−6.248 MHz.

Developing generations of global positioning system (GPS) satellites transmit L1-C signals, which is the fourth civilian GPS signal, designed to enable interoperability between GPS and international satellite navigation systems. The radio frequency used by the signal is 1575 MHz or L1. L1-C features a multiplexed binary offset carrier (MBOC) modulation scheme, which improves mobile GPS reception in cities and other challenging environments.

A pilot signal L1-$C_P$ of the L1-C signal uses a TMBOC format, unlike a data signal L1-$C_D$ of the L1-C signal. Specifically, GPS L1-$C_P$ transmits a TMBOC(1,1,6) signal, which is time-multiplexed BOC(1,1) and BOC(6,1) signals.

Most consumer receivers use a narrower bandwidth and are incapable of passing the wider bandwidth of the signal. Accordingly, such receivers are incapable of receiving BOC (6,1) energy since a receiver would need to be greater than approximately 14 MHz (two-sided bandwidth). This normally results in a loss of approximately 0.6 dB of $CN_0$. In modern receivers every 0.1 dB of $CN_0$ loss/gain is considered important.

FIG. 1 is a diagram illustrating a matched filter operation. The matched filter computes a correlation between incoming signal samples and a locally generated code. A local code generator 102 generates a local code that is fed into a local code register 104. The signal samples are fed into a signal processor 106 and processed based on frequencies from a carrier numerically-controlled oscillator (NCO) 108. The processed signal samples are fed to a quantizer 110 where they are digitized to ensure quantization errors and dynamic ranges are appropriate for signal characteristics. The quantized signal samples are fed to a signal register 112. A length of the signal register 112 is typically considered to be relatively long, such as, for example, 1023 or 2046 samples long. An adder tree 114 computes a signal correlation value between the signal register 112 and the local code register 104, and outputs a correlation result. The signal register 112 and the local code register 104 can be shifted to compute correlation at other time delays.

SUMMARY

According to an embodiment, a method is provided for improving $CN_0$ of a matched filter. A signal is received at a signal register of the matched filter. A local code is received at a local code register and a nulling register of the matched filter. An adder tree of the matched filter correlates the signal register and the local code register with respect to the nulling register to obtain a correlation result. The nulling register prevents high frequency samples of the signal register from affecting the correlation result.

According to an embodiment, a matched filter is provided for improving $CN_0$. The matched filter includes a signal register receiving a signal, a local code register receiving a local code, and a nulling register receiving the local code. The matched filter also includes an adder tree correlating the signal register and the local code register with respect to the nulling register to obtain a correlation result. The nulling register prevents high frequency samples of the signal register from affecting the correlation result.

BRIEF DESCRIPTION OF THE DRAWINGS

The above and other aspects, features, and advantages of certain embodiments of the present disclosure will be more apparent from the following detailed description, when taken in conjunction with the accompanying drawings, in which:

FIG. 4 is a chart showing simulated results of $CN_0$ loss/gain, according to an embodiment of the disclosure;

DETAILED DESCRIPTION

Figure 1:
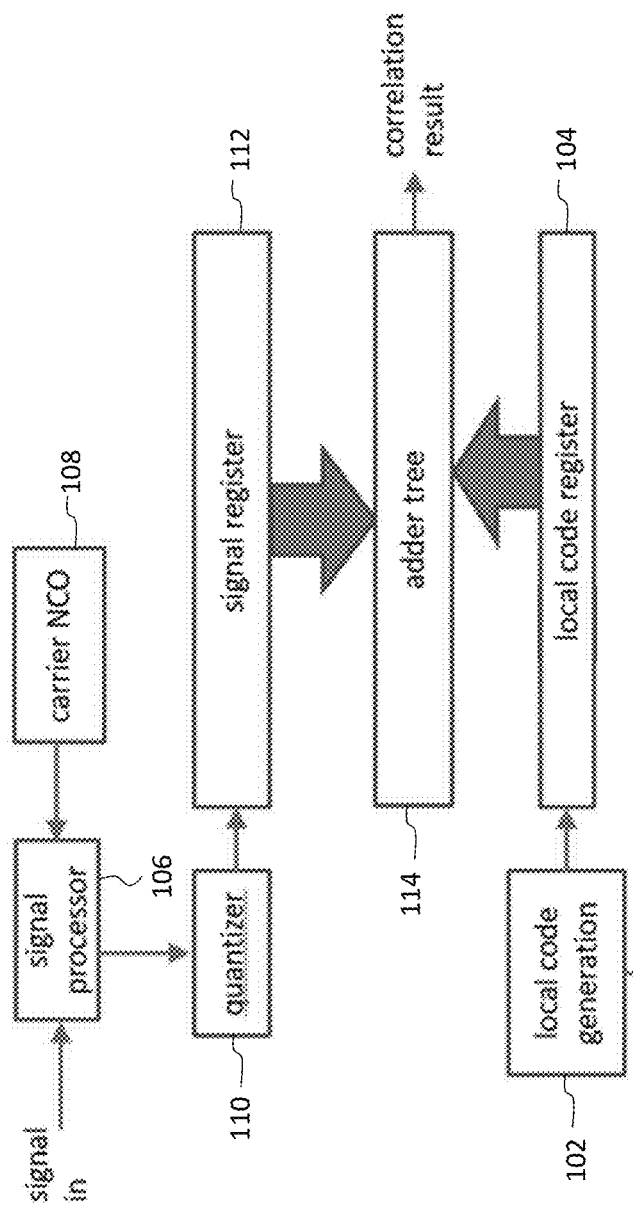
FIG. 1 is a diagram illustrating a matched filter operation.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms.

The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate the existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, such as, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

Embodiments of the disclosure describe an architecture that provides GPS narrowband receivers a gain of approximately 0.6 db of $CN_0$ for L1-$C_P$-enabled satellites. Specifically, embodiments describe a modified matched filter with local code or incoming signal nulling mechanism that is aligned with high frequency BOC (1,6) timing. Nulling means a sample does not contribute to the correlation output, positively or negatively. For example, when receiving BOC (6,1), the correlation output is unaffected.

Figure 2:
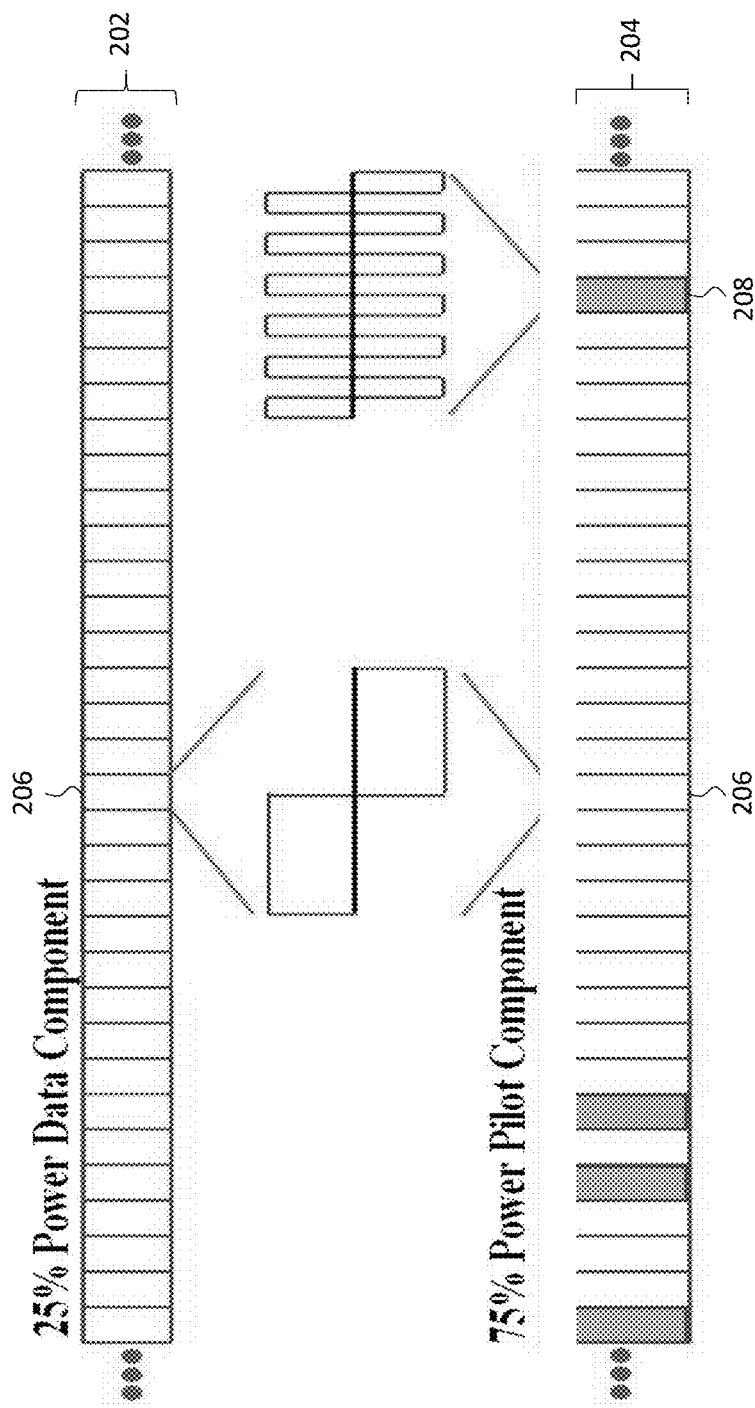
FIG. 2 is a diagram illustrating the GPS L1-C signal BOC timing format.

FIG. 2 is a diagram illustrating the GPS L1-C signal BOC timing format. An L1-$C_D$ channel 202 and an L1-$C_P$ channel 204 each have 33 segments of 31 samples each. The L1-$C_D$ channel 202 uses BOC(1,1) modulation with 25% of the total power. Specifically, the L1-$C_D$ channel 202 includes 33 segments of BOC(1,1) spreading symbols 206. The L1-$C_P$ channel 204 uses 75% of the total power to achieve a desired power ratio between BOC(1,1) and BOC(6,1) spreading symbols. Each BOC(6,1) spreading symbol consists of six cycles of a 6×1.023 MHz square wave, with a total duration of 1/1.023 microseconds. The L1-$C_P$ channel 204 includes 4 segments of BOC(6,1) spreading symbols 208 and 29 segments of the BOC(1,1) spreading symbols 206 for every 33 segments. Specifically, all spreading symbols in L1-$C_P$ are BOC(1,1) except for those that are BOC(6,1) that occur at times 0, 4, 6, and 29 in a sequence from 0 to 32.

According to an embodiment of the disclosure, at times when the BOC(6,1) signal is transmitted, an incoming signal has zero impact on the correlation result.

Figure 3:
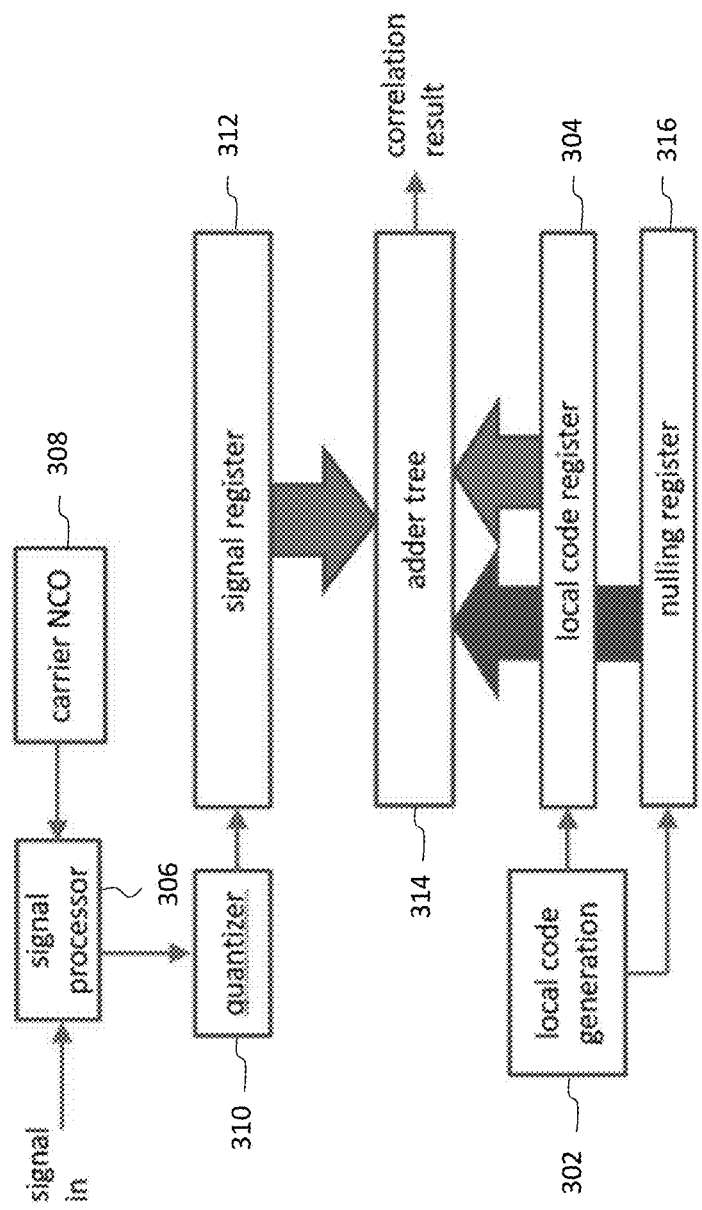
FIG. 3 is a diagram illustrating a matched filter operation, according to an embodiment of the disclosure.

Referring to FIG. 3, a diagram illustrates a matched filter operation, according to an embodiment of the disclosure.

The matched filter computes a correlation between incoming signal samples. A local code generator 302 generates a 1-bit stream local code that is fed into a local code register 304 and a nulling register 316. The nulling register 316 is provided to represent an arithmetic zero. The signal samples are fed into a signal processor 306 and processed based on frequencies from a carrier NCO 308. The processed signal samples are fed to a quantizer 310 where they are digitized to ensure quantization errors and dynamic ranges are appropriate for signal characteristics. The quantized signal samples are fed to a signal register 312. An adder tree 314 computes a signal correlation value between the signal register 312, the local code register 304, and the nulling register 316, and outputs a correlation result. Contents of the nulling register 316 are consumed by a first layer of the adder tree 314.

Accordingly, as described above with respect to FIG. 2, at times when the BOC(6,1) signal is transmitted, the nulling register 316 prevents an incoming signal from having an impact on the correlation result. More specifically, the nulling of the matched filter is aligned with the timings of the high frequency BOC(6,1).

For Galileo E1-B and E1-C signals, if data on E1-B is known, the local code is represented as {−2, 0, +2} states. The new architecture of the matched filter described with respect to FIG. 3 can handle this with a single pass. Specifically, the E1-B and E1-C signals can be processed simultaneously. The local code represents states {−2, +2} and the nulling register represents state {0}. Additionally, having a zero represented allows the signal to be truly nulled when an interfering signal is present, such as, for example, during a pulsed jammer interval. The signal can be nulled down to a resolution of a single sample. A receiver with the architecture of FIG. 3 is able to provide TMBOC, Galileo 3-state local code and nulling in the presence of an interfering signal by providing modes that can satisfy each.

FIG. 4 is a chart showing simulated results of $CN_0$ loss/gain, according to an embodiment of the disclosure. Specifically, for a full mode having a transmission mode using BOC(6,1), a reception mode using BOC(6,1), and a reception bandwidth of 10 MHz, the $CN_0$ is 49.96 dB-Hz. For a transmission mode using BOC(6,1) and a reception mode using BOC(1,1), and a reception bandwidth of 10 MHz, the $CN_0$ is 48.90. This shows a $CN_0$ loss of 1.06 dB from the full mode.

For a first consumer mode having a transmission mode using BOC(6,1), a reception mode using BOC(1,1), and a reception bandwidth of 3 MHz, the $CN_0$ is 48.61. This shows a $CN_0$ loss of 1.35 dB from the full mode. This first consumer mode is enabled by the architecture of FIG. 1.

For a modified consumer mode, according to embodiments of the disclosure, having a transmission mode using BOC(6,1), a reception mode using BOC(1,1), and a reception bandwidth of 3 MHz, the $CN_0$ is 49.20. This shows a $CN_0$ loss of 0.76 dB from the full mode, which is a 0.59 dB gain from the first consumer mode. This modified consumer mode is enabled by the architecture of FIG. 3.

Figure 5:
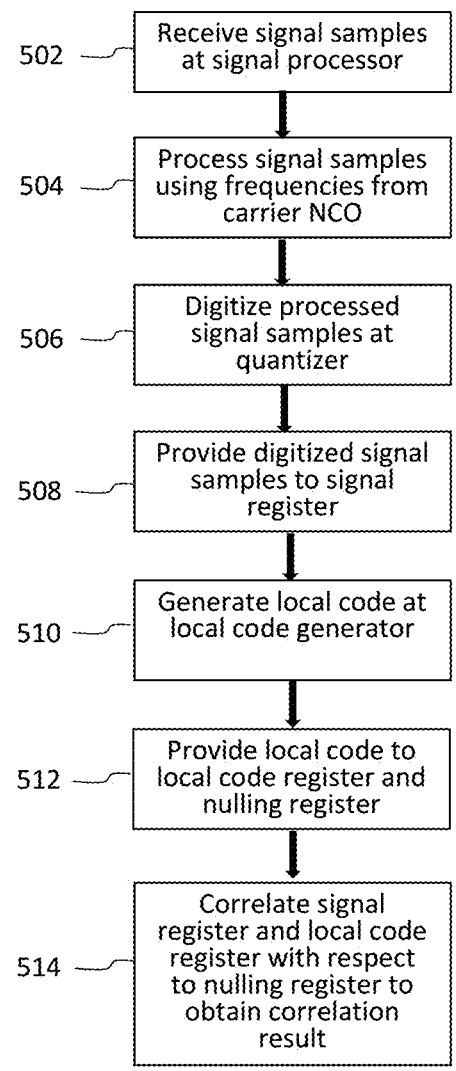
FIG. 5 is a flow chart illustrating a method for improving $CN_0$ of a matched filter, according to an embodiment of the disclosure.

FIG. 5 is a flow chart illustrating a method for improving $CN_0$ of a matched filter, according to an embodiment of the disclosure. At 502, signal samples are received at a signal processor of the matched filter. At 504, the signal samples are processed using frequencies from a carrier NCO of the matched filter. At 506, the processed signal samples are digitized at a quantizer of the matched filter. At 508, the digitized signal samples are provided to a signal register of the matched filter. At 510, a local code is generated at a local code generator of the matched filter. The local code is 1-bit stream local code. At 512, the local code is provided to a local code register and a nulling register of the matched filter. At 514, an adder tree of the matched filter correlates the signal register and the local code register with respect to the nulling register to obtain a correlation result. The nulling register prevents high frequency samples of the signal register from affecting the correlation result. The high frequency samples are the BOC(6,1) spreading symbols of the L1-$C_P$ channel, as described above with respect to FIGS. 2-4.

Figure 6:
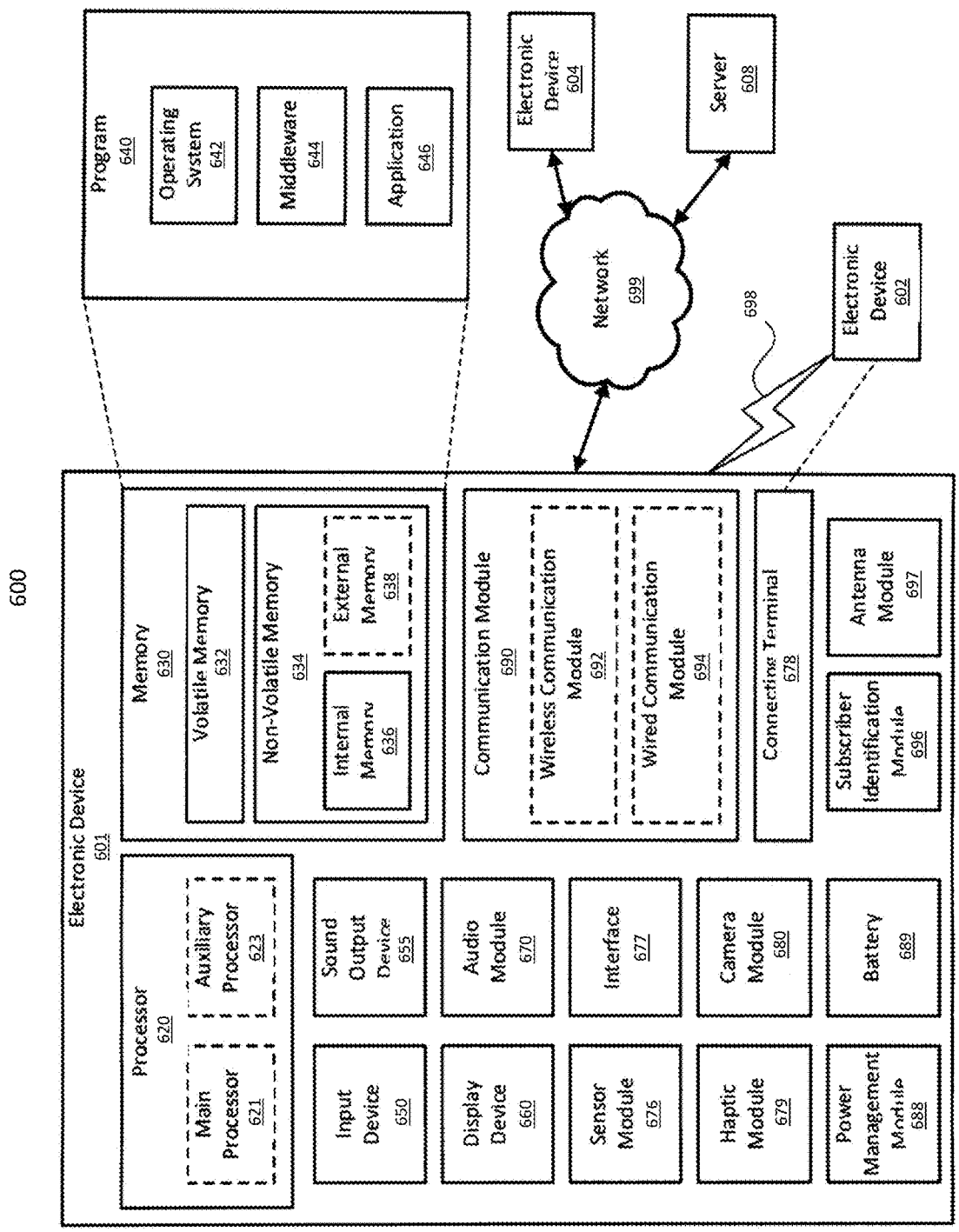
FIG. 6 is a block diagram of an electronic device in a network environment, according to an embodiment of the disclosure.

FIG. 6 is a block diagram of an electronic device in a network environment, according to one embodiment. Referring to FIG. 6, an electronic device 601 in a network environment 600 may communicate with an electronic device 602 via a first network 698 (e.g., a short-range wireless communication network), or an electronic device 604 or a server 608 via a second network 699 (e.g., a long-range wireless communication network). The electronic device 601 may communicate with the electronic device 604 via the server 608. The electronic device 601 may include a processor 620, a memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) 696, or an antenna module 697. In one embodiment, at least one (e.g., the display device 660 or the camera module 680) of the components may be omitted from the electronic device 601, or one or more other components may be added to the electronic device 601. Some of the components may be implemented as a single integrated circuit (IC). For example, the sensor module 676 (e.g., a fingerprint sensor, an iris sensor, or an illuminance sensor) may be embedded in the display device 660 (e.g., a display).

The processor 620 may execute, for example, software (e.g., a program 640) to control at least one other component (e.g., a hardware or a software component) of the electronic device 601 coupled with the processor 620, and may perform various data processing or computations. As at least part of the data processing or computations, the processor 620 may load a command or data received from another component (e.g., the sensor module 676 or the communication module 690) in volatile memory 632, process the command or the data stored in the volatile memory 632, and store resulting data in non-volatile memory 634. The processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or execute a particular function. The auxiliary processor 623 may be implemented as being separate from, or a part of, the main processor 621.

The auxiliary processor 623 may control at least some of the functions or states related to at least one component (e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). The auxiliary processor 623 (e.g., an image signal processor or a communication processor) may be implemented as part of another component (e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory 634.

The program 640 may be stored in the memory 630 as software, and may include, for example, an operating system (OS) 642, middleware 644, or an application 646.

The input device 650 may receive a command or data to be used by another component (e.g., the processor 620) of the electronic device 601, from the outside (e.g., a user) of the electronic device 601. The input device 650 may include, for example, a microphone, a mouse, or a keyboard.

The sound output device 655 may output sound signals to the outside of the electronic device 601. The sound output device 655 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. The display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. The audio module 670 may obtain the sound via the input device 650, or output the sound via the sound output device 655 or a headphone of an external electronic device 602 directly (e.g., wired) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. The sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device 602 directly (e.g., wired) or wirelessly. The interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device 602. The connecting terminal 678 may include, for example, an HDMI connector, a USB connector, an SD card connector, or an audio connector (e.g., a headphone connector).

The haptic module 679 may convert an electrical signal into a mechanical stimulus (e.g., a vibration or a movement) or an electrical stimulus which may be recognized by a user via tactile sensation or kinesthetic sensation. The haptic module 679 may include, for example, a motor, a piezoelectric element, or an electrical stimulator.

The camera module 680 may capture a still image or moving images. The camera module 680 may include one or more lenses, image sensors, image signal processors, or flashes.

The power management module 688 may manage power supplied to the electronic device 601. The power management module 688 may be implemented as at least part of, for example, a power management integrated circuit (PMIC).

The battery 689 may supply power to at least one component of the electronic device 601. The battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the AP) and supports a direct (e.g., wired) communication or a wireless communication. The communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or a standard of the Infrared Data Association (IrDA)) or the second network 699 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The antenna module 697 may transmit or receive a signal or power to or from the outside (e.g., the external electronic device) of the electronic device 601. The antenna module 697 may include one or more antennas, and, therefrom, at least one antenna appropriate for a communication scheme used in the communication network, such as the first network 698 or the second network 699, may be selected, for example, by the communication module 690 (e.g., the wireless communication module 692). The signal or the power may then be transmitted or received between the communication module 690 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

Commands or data may be transmitted or received between the electronic device 601 and the external electronic device 604 via the server 608 coupled with the second network 699. Each of the electronic devices 602 and 604 may be a device of a same type as, or a different type, from the electronic device 601. All or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

One embodiment may be implemented as software (e.g., the program 640) including one or more instructions that are stored in a storage medium (e.g., internal memory 636 or external memory 638) that is readable by a machine (e.g., the electronic device 601). For example, a processor of the electronic device 601 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method for improving carrier to noise density ratio of a matched filter, the method comprising:
    receiving a signal at a signal register of the matched filter;
    receiving a local code at a local code register and a nulling register of the matched filter; and
    correlating, at an adder tree of the matched filter, the signal register and the local code register with respect to the nulling register to obtain a correlation result, wherein the nulling register prevents high frequency samples of the signal register from affecting the correlation result.

2. The method of claim 1, wherein the matched filter corresponds to a narrowband receiver in a global navigation satellite system (GNSS).

3. The method of claim 2, wherein the signal is a time multiplexed binary offset carrier (TMBOC) transmission.

4. The method of claim 3, wherein the TMBOC transmission comprises an L1-$C_P$ channel having binary offset carrier (BOC)(1,1) and BOC(6,1) spreading symbols.

5. The method of claim 4, wherein the high frequency samples comprise the BOC(6,1) spreading symbols of the L1-$C_P$ channel.

6. The method of claim 1, wherein receiving the signal comprises:
    receiving signal samples at a signal processor of the matched filter; and
    processing the signal samples using frequencies from a carrier numerically-controlled oscillator (NCO) of the matched filter.

7. The method of claim 6, wherein receiving the signal further comprises:
    digitizing the processed signal samples at a quantizer of the matched filter; and
    providing the digitized processed signal samples to the signal register.

8. The method of claim 1, wherein receiving the local code comprises:
    generating the local code at a local code generator of the matched filter.

9. The method of claim 8, wherein the local code is a 1-bit stream local code.

10. The method of claim 1, wherein the nulling register is aligned with timings of the high frequency samples of the signal register.

11. A matched filter for improving carrier to noise density ratio, the matched filter comprising:
    a signal register receiving a signal;
    a local code register receiving a local code;
    a nulling register receiving the local code; and
    an adder tree correlating the signal register and the local code register with respect to the nulling register to obtain a correlation result, wherein the nulling register prevents high frequency samples of the signal register from affecting the correlation result.

12. The matched filter of claim 11, wherein the matched filter corresponds to a narrowband receiver in a global navigation satellite system (GNSS).

13. The matched filter of claim 12, wherein the signal is a time multiplexed binary offset carrier (TMBOC) transmission.

14. The matched filter of claim 13, wherein the TMBOC transmission comprises an L1-$C_P$ channel having binary offset carrier (BOC)(1,1) and BOC(6,1) spreading symbols.

15. The matched filter of claim 14, wherein the high frequency samples comprise the BOC(6,1) spreading symbols of the L1-$C_P$ channel.

16. The matched of claim 11, further comprising:
    a carrier numerically-controlled oscillator (NCO) outputting frequencies; and
    a signal processor receiving signal samples and processing the signal samples using the frequencies from the carrier NCO.

17. The matched filter of claim 16, further comprising:
    a quantizer digitizing the processed signal samples and providing the digitized processed signal samples to the signal register.

18. The matched filter of claim 11, further comprising:
    a local code generator generating the local code and providing the local code to the local code register and the nulling register.

19. The matched filter of claim 18, wherein the local code is a 1-bit stream local code.

20. The matched filter of claim 11, wherein the nulling register is aligned with timings of the high frequency samples of the signal register.

* * * * *